United States Patent [19]

West

[11] Patent Number: 4,709,371

[45] Date of Patent: Nov. 24, 1987

[54] VARIABLE WAVELENGTH LASER DIODE

[76] Inventor: Fred D. West, 6800 Curry Dr., Box 32514, The Colony, Tex. 75056

[21] Appl. No.: 789,194

[22] Filed: Oct. 18, 1985

[51] Int. Cl.$^4$ ............................................. H01S 3/19
[52] U.S. Cl. ...................................... 372/44; 357/17; 372/20; 372/108; 455/609
[58] Field of Search ....................... 372/44, 50, 20, 92, 372/108, 48; 357/17; 455/609, 610, 611

[56] References Cited

U.S. PATENT DOCUMENTS

| Re. 27,694 | 7/1973 | Kressel et al. | 331/94.5 |
|---|---|---|---|
| 3,340,479 | 9/1967 | Ashkin | 331/94.5 |
| 3,439,169 | 4/1969 | Lynch | 250/199 |
| 3,479,614 | 11/1969 | Ashkin | 331/94.5 |
| 3,525,947 | 8/1970 | Winstel et al. | 330/4 |
| 3,747,021 | 7/1973 | Smiley | 331/94.5 |
| 3,978,426 | 8/1976 | Logan et al. | 331/94.5 |
| 3,993,963 | 11/1976 | Logan et al. | 331/94.5 |
| 4,520,485 | 5/1985 | Sugino et al. | 372/48 |
| 4,605,946 | 8/1986 | Camlibel et al. | 357/17 |

OTHER PUBLICATIONS

Cheo, Peter K., Fiber Optics Devices and Systems, N.J., Prentice-Hall, 1985, pp. 180-211. TA1800.C48.

Primary Examiner—James W. Davie
Attorney, Agent, or Firm—Saul Elbaum; Thomas F. McDonald; Guy M. Miller

[57] ABSTRACT

A semiconductor laser diode capable of generating variable wavelengths includes an oxide layer having an elongated cavity or gap formed through the oxide layer for outputting a band of wavelengths therefrom. A fiber optic may be connected to the cavity or gap to operate the diode as a light modulating transmitter.

11 Claims, 9 Drawing Figures

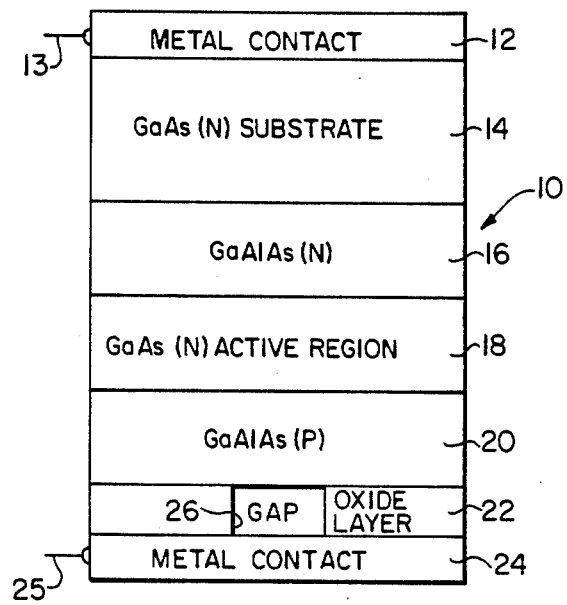
FIG. 1
PRIOR ART
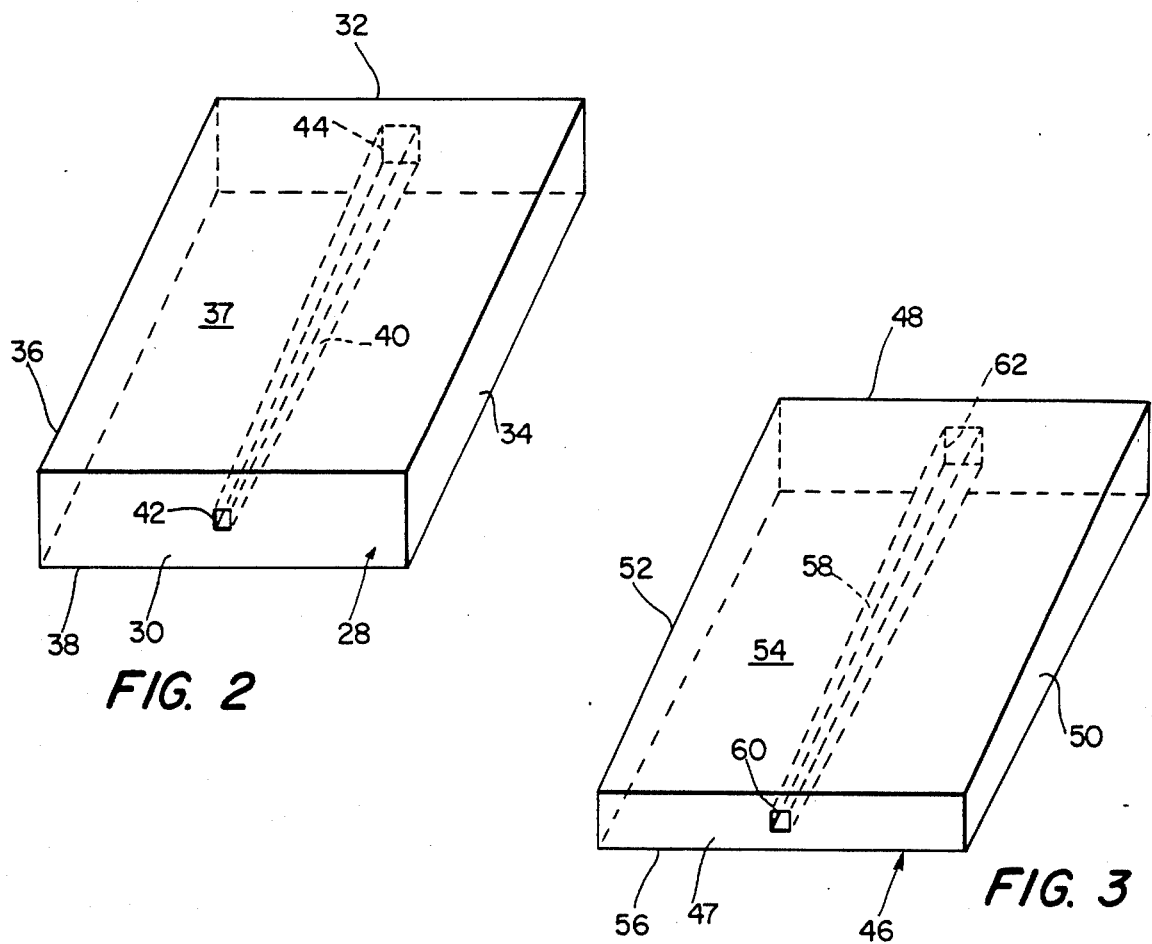
FIG. 2
FIG. 3

VARIABLE WAVELENGTH LASER DIODE

RIGHTS OF THE GOVERNMENT

The invention described herein may be manufactured, used, and licensed by or for the United States Government for governmental purposes without the payment to me of any royalty thereon.

BRIEF DESCRIPTION OF THE PRIOR ART

In a number of fiber optic communication systems, semiconductor laser devices are employed in a modulating transmitter. Currently, a separate laser diode is used for each desired wavelength of the transmitter. By using multiple lasers, it is possible to take advantage of all the low attenuation points found in fiber optic cables. The major disadvantages with multiple laser include the coupling difficulties in multiplexing of outputs into a single fiber. Secondly, there is the inherent decrease of reliability associated with multiple devices.

BRIEF DESCRIPTION OF THE PRESENT INVENTION

The present invention is directed to a semiconductor laser device capable of outputting a band of wavelengths for use as a modulating transmitter in fiber optics. The present design solves the multiplexing problem of the prior art by providing all the low attenuation wavelength points outputs into a single fiber. Reliability is greatly improved since only a single device is used.

The inventive device incorporates a novel relationship between an oxide layer and adjoining layers for laser diode construction.

An attendant advantage of the invention is the ability to provide greater data density by making more wavelengths available. This is made possible by the elimination of the complex multiplexing scheme utilized by the multiple devices of the prior art.

The above-mentioned objects and advantages of the present invention will be more clearly understood when considered in conjunction with the accompanying drawings, in which:

BRIEF DESCRIPTION OF THE FIGURES

FIG. 1 is a front elevational view of a typical multilayer fixed wavelength laser diode.

FIG. 2 is a perspective view of a modified oxide layer which forms a first embodiment of the invention.

FIG. 3 is a perspective view of a modified oxide layer which forms a second embodiment of the invention.

DETAILED DESCRIPTION OF THE INVENTION

Figure 4:
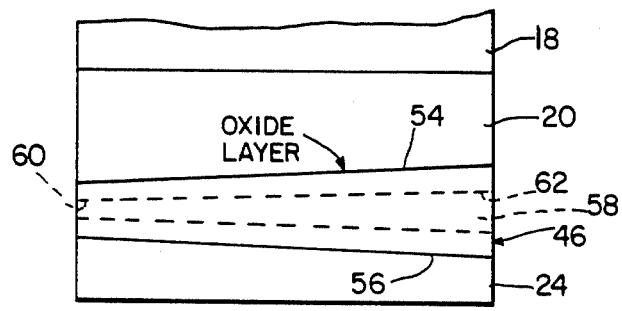
FIG. 4 is a side elevational view of the oxide layer as illustrated in FIG. 3.

Certain materials, when electrically excited, emit coherent energy in the form of photons. This provides the basis for the injection laser. For purposes of illustration, a prior art gallium aluminum arsenide device 10 is shown in FIG. 1 and will be described. The structure of the GaAlAs device includes a first metal contact or electrode 12 to which lead 13 is connected. A GaAs substrate 14 forms a second layer including an n-type dopant. Deposited on substrate 14 is a layer 16 of GaAlAs also containing dopant to make the layer n type. The succeeding layer 18 is n type GaAs and serves as the diode's active region. A final semiconductor layer 20 is similar to that of layer 16 in that it consists of GaAlAs. However it has been doped so that the layer is of the p type. An oxide layer 22 contacts the semiconductor layer 20 and has a centrally positioned gap 26 disposed therein. A second metal contact or electrode 24 completes the device and has a lead 25 connected to it. Layer 18, which is the active region, has an aluminum content typically ranging between zero and 10 percent depending upon the desired emission wavelength. GaAs has a bandgap resulting in wavelength emission approximately equal to 900 nanometers while a 10 percent addition of aluminum results in wavelength emission approximately 100 nanometers less. The GaAlAs layers 16 and 20, which sandwich the active region layer 18 have aluminum content between 20 to 40 percent. This provides a containing potential to maintain the electrons and holes in the active region. Also, due to the refractive index of the GaAlAs being lower than GaAs, light generated in the active region is perpendicular to the junction by waveguiding action. Light confinement parallel to the junction is the portion which carries the injected current to the oxide layer. The gap 26 in the oxide layer 22 is defined by the three directions of confinement. The laser oscillates in a number of modes simultaneously due to geometry or imperfections in fabrication. The gap resonance has a number of oscillatory modes for the same reason. The oxide layer gap has all the characteristics of a waveguide.

The wavelength of the emitted energy is determined by the composition of the semiconductor material, its bandgap energy, the symmetry of the cleaved surfaces, the dimensions of the oxide gap, and slab geometry.

In the present invention, a variable wavelength output device is developed through altering the geometry of a fixed wavelength device of the type just discussed in connection with FIG. 1. This is achieved by two principal modifications to the prior art device. First, the variable wavelength capability is achieved by tapering a resonant cavity in an oxide layer. A second basic approach is to alter the cleaved surface relationship at the active junction. Of these two basic methods, the tapering of the cavity has the greatest effect. The present invention further contemplates a combination of these two principal approaches.

In order to provide a controlled variable wavelength diode laser, geometry is the primary determinant of emitted wavelengths. Existing laser diodes currently produce spurious wavelengths due to process imperfections and the waveguide effect of an oxide layer gap. GaAs emits primarily in the 900 nanometer point, however, spurious emissions range from 400 nanometers to 900 nanometers. By taking advantage of, and enhancing the natural tendency of certain materials to emit a band of wavelengths, a variable wavelength laser diode is feasible.

FIG. 2 illustrates a modification of the oxide layer previously indicated at reference numeral 22 of FIG. 1. As so modified, a resulting semiconductor structure of the type shown in FIG. 1 forms the first embodiment of the present invention. The oxide layer 28 is preferably fabricated from $SiO_2$ and is basically a rectangular block having equally dimensioned front and rear sides 30, 32. The right and left sides 34 and 36 are longer than the front and rear sides but are themselves equally dimensioned. The top and bottom 37 and 38 complete the added geometrical surfaces of layer 28. A tapered cavity 40 is centrally located within the layer 28 and extends between the front and rear sides. The cross sectional area of the cavity is square and increases toward the rear side. By way of example, the length and width of the front opening 42 may each be 1.0 micron while the length and width of the cavity opening 44 in the rear side is 2.0 microns. Also by way of example, the outer dimensions of the oxide layer 28 may include a length of 25.0 microns, width of 20.0 microns and height of 5.0 microns.

Thus, the cavity 40, which serves as a waveguide, has a linear taper from front to back sides for all four internal surfaces.

FIG. 3 introduces an alternate embodiment of the invention wherein an oxide layer 46 is to be substituted for layer 22 of FIG. 1. In this embodiment a tapered oxide layer with tapered cavity exists. Front and rear surfaces 47, 48 are rectangular but the dimensions of the rear edge 48 are greater than those of front edge 47. The side edges 50 and 52 are tapered to conform with the tapered cavity 58 which may be identical to that of cavity 40 discussed in connection with FIG. 2. Namely, a square opening 60 is formed at the front edge while a larger square opening 62 is formed in the rear edge. The cavity 58 is linearly tapered on all four internal sides from front to rear. As indicated, the cavity is completely internal to the oxide layer. The oxide layer may be tapered to be parallel with the cavity taper. It may also be tapered in a logarithmic, exponential, concave or convex manner. Mathematical determination indicates the frequency cutoff points would be altered within the waveguide which would provide higher energy wavelengths at some specific points and eliminate other wavelengths altogether. The oxide layer taper provides a modified attenuation to the energy being propagated into the wavelength, thus providing slightly better power coupling. Since the oxide layer is tapered as most clearly shown in FIG. 4, the GaAlAs semiconductor layer 20 is tapered along its bottom surface, in common with upper surface 54 of the oxide layer 46. Similarly, the upper surface of metal contact layer 24 is tapered in conformance with the lower surface 56 of the oxide layer 46. The conforming tapers of the layers above and below the oxide layer are necessary in order to provide a good junction. The remaining layers need not be so tapered.

Figure 5:
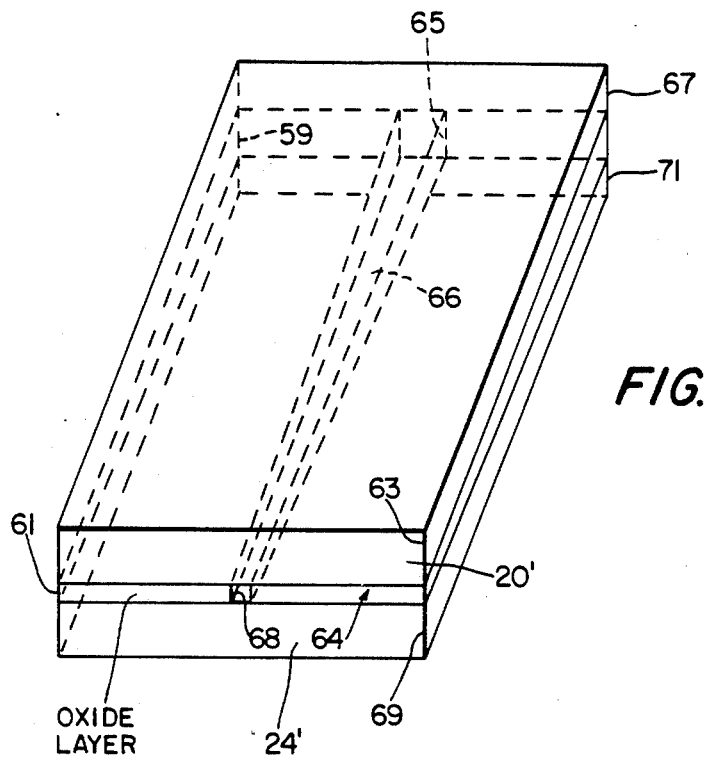
FIG. 5 is a perspective view of tapered layers and tapered gap forming a third embodiment of the invention.

FIG. 5 shows a further embodiment of the invention utilizing a tapered gap in an oxide layer 64, in lieu of the non-tapered gap 26 as discussed in connection with FIG. 1. As will be seen from the illustration of FIG. 5, both the GaAlAs layer 20' and metal contact layer 24' vary in height from front to rear, with no variation in width. Thus, front heights 63 and 69 are greater than the corresponding rear heights 67 and 71. This is necessary in order to accommodate the greater height 59 at the rearward edge of the oxide layer 64 as compared with the forward edge 61 thereof. The gap 66 also tapers outwardly as evidenced by a square opening 68 at the forward edge of oxide layer 64 and enlarged square opening 65 at the rear edge thereof. Each of the layers is constant in width. Although all configurations are current dependent for propagation, this particular construction is current critical. The output wavelength may virtually be selected by varying the input current to the device. Since maximum gap exposure to the layer 20' is present, energy propagation should be greatest with control ability being somewhat difficult.

Figure 6:
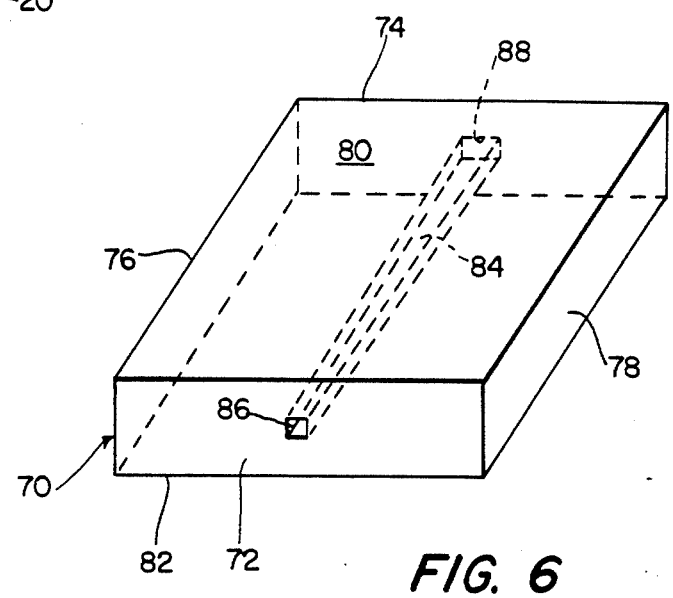
FIG. 6 is a perspective view of an oxide layer having tapered width and tapered cavity forming a fourth embodiment of the invention.

The remaining embodiments produce the same variable wavelength output as those of the previously discussed embodiments. The embodiments which follow are based on varying height or width through the oxide layer, but not simultaneously. A tapered width oxide layer cavity illustrated in FIG. 6 gives the basic approach for these embodiments. The particular embodiment illustrated in FIG. 6 has ease of manufacture as a definite advantage. Extremely high tolerance resolution is not required as with an equilateral waveguide approach. Tapered width oxide layer cavity construction is internal to the oxide layer and may be combined with the tapered oxide layer. Considering FIG. 6 with particularity, the rectangularly shaped oxide layer 70 has front and rear edges 72, 74 and top and bottom surfaces 80, 82. The cavity 84 has a square opening 86 on the front edge 72 and tapers outwardly in width to rear opening 88 which is rectangularly shaped. The height of both openings 86 and 88 is the same with the widths being altered.

Figure 7:
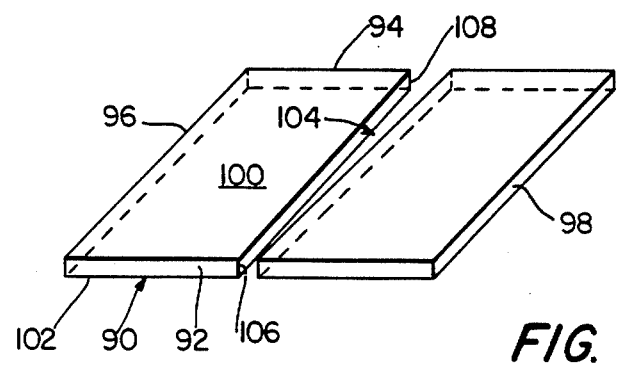
FIG. 7 is a perspective view of an oxide layer having a tapered width and tapered gap forming a fifth embodiment of the invention.

The design of the oxide layer in FIG. 6 may be extended to a tapered width oxide layer gap embodiment as illustrated in FIG. 7. The use of the gap primarily provides higher output power and better coupling, in addition to somewhat simplified manufacturing procedures. As in the case of all gap formations in an oxide layer, there is complete separation of the oxide material and the oxide layer is dependent upon the layers underneath and above it for support.

In particular consideration of FIG. 7, the tapered width oxide layer 90 is seen to include a separated forward edge 92 and separated rearward edge 94. Side edges 96 and 98 define the lateral boundaries of the oxide layer while top and bottom surfaces 100 and 102 complete the boundary surfaces of the oxide layer. The gap 104 has an increasingly tapering width with a typically small square opening 106 at the forward edge thereof and a rectangular gap opening 108 at the rearward edge of the oxide layer, the height of the entire oxide layer including the gap being constant throughout.

Figure 8:
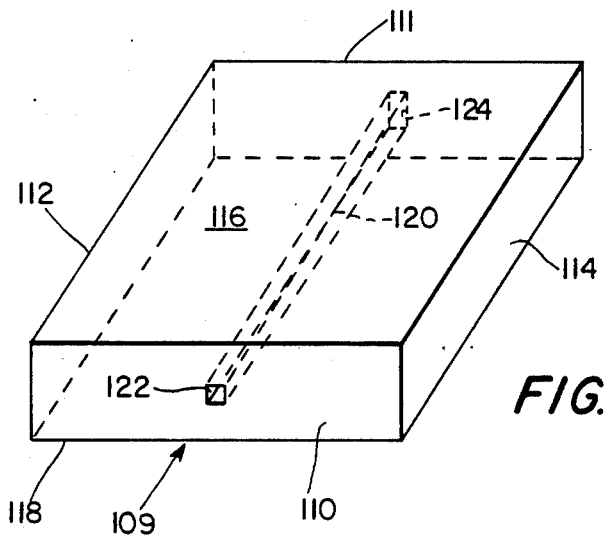
FIG. 8 is a perspective view of an oxide layer having tapered height and a tapered cavity forming a sixth embodiment of the invention.

The tapered height oxide layer cavity illustrated in FIG. 8 presents a further embodiment and takes advantage of varying relationships with adjoining layers for energy transfer and the variable wavelength effect. The illustrated embodiment of FIG. 8 may be further modified by tapering the oxide layer itself.

Considering the structure of the oxide layer 109, there are front and rear edges 110, 110 and side edges 112 and 114. The oxide layer is bounded by top and bottom surfaces 116 and 118. The cavity 120 has a constant width but tapers in height between the forward located opening 122 of square-shaped cross section to a rectangular opening 124 in rear edge 111. The width of the openings 122 and 124 remains constant along the entire length of cavity 120.

Figure 9:
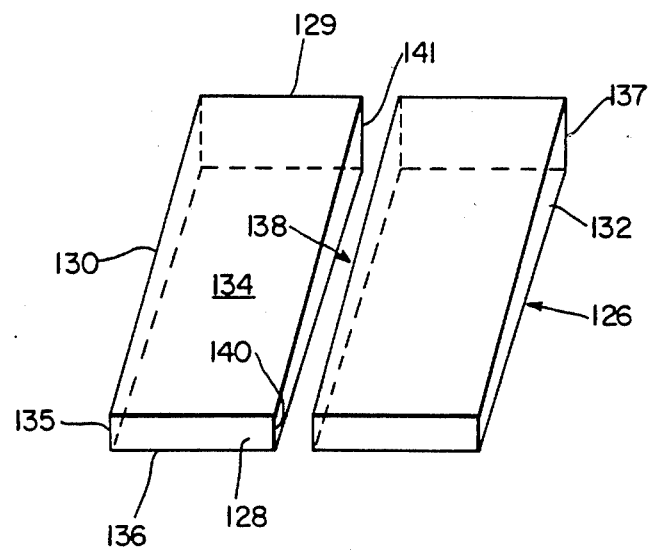
FIG. 9 is a perspective view of an oxide layer having tapered height and a tapered gap forming a seventh embodiment of the invention.

FIG. 9 illustrates a tapered height oxide layer with tapered height gap. The layer 126 has a separated forward edge 128 and separated rearward edge 129. Side edges 130 and 132 laterally bound the oxide layer while top surface 134 and bottom surface 136 complete the outward surfaces of the oxide layer 126. As will be observed the forward height 135 is less than that of rearward height 137 thereby creating a wedge-shaped or tapered oxide layer 126. Since a gap 138 centrally exists through the entire layer, a similar height relationship exists at the forward opening 140 of the gap and the rearward opening 141 thereof.

The following assumptions from waveguide theory are applied to the variable wavelength laser diode in all embodiments:
1. Certain semiconductor materials have specific band gap energy emission points.
   a. Pure Gallium Arsenide's band gap is 900 nanometers.
2. The energy emitted from certain semiconductor materials is specific. For example, the emitted energy of Gallium Arsenide is at a wavelength of 900 nanometers.
3. Electromagnetic energy in the form of waves can travel through a waveguide only if the propagated frequency is greater than a cutoff frequency.
4. For a wave launched into a narrowing waveguide, the electric field strength increases as the guide narrows and the cutoff frequency increases. The reverse is also true, a wave launched into a widening waveguide, the electric field strength decreases as the guide widens, and the cutoff frequency decreases.

Bases on these four assumptions, a waveguide may be constructed to alter a fixed wavelength output to a variable wavelength output. A 900 nm wave injected into a 0.9 micron opening will propagate at a frequency of 330,000 GHz. A one micron opening produces a cutoff frequency of 299,800 GHz. since a 900 nm wavelength has a frequency higher than the cutoff frequency, it will be carried by the waveguide. Induced shorter wavelengths will not be carried at this point in the waveguide since their respective frequencies are lower than the cutoff frequency. At the 1.5 micron point of the waveguide, all frequencies greater than 199,867 GHz will be carried. At the two micron point, all frequencies greater than 149,900 GHz will be transmitted. At each widening point in the waveguide, variable wavelengths will be induced into the waveguide providing a group of frequencies. The wave group velocities will decrease as will electric field strength with the widening of the waveguide and with distance traveled. This loss of energy due to the widening of the waveguide is primarily due to the propagation of lower frequency components. As the 900 nm wave looses energy due to waveguide attenuation and shifting frequency, other wavelengths are propagated relative to lateral and vertical positions within the waveguide. This should prove to be a linear correlation with energy equal to zero at the final output wavelength. This characteristic necessitates the design of the waveguide such that the final desired output wavelength is less than the absolute output wavelength.

Due to limitations and specific characteristics of waveguides used in semiconductor devices, the following relationship must be observed for all described embodiments:
1. Desired output wavelength must be shorter than the absolute final output wavelength.
2. As output energy approaches zero with the final output wavelength, the group wave velocity also approaches zero. Therefore, the desire output wavelength energy must be determined relative to the distance in the waveguide to the final output point in order to have sufficient energy for transmission.
3. Input energy is defined relative to the desired energy output at the wavelength specified prior to the zero energy point.
4. The initial input wavelength is shorter than the output wavelength, and wavelength will vary with distance. The input frequency is greater than the output frequency with frequency varying with distance.

Although the present invention has been discussed in terms of GaAlAs laser diodes, it should be understood that the invention is not limited to this material. The invention is applicable to the family of laser diodes and all other appropriate energy transference semiconductor devices, or any device which takes advantage of the unique design of tapered layer semiconductor technology as presented herein.

It should be understood that the invention is not limited to the exact details of construction shown and described herein for obvious modifications will occur to persons skilled in the art.

I claim:
1. A variable wavelength semiconductor laser comprising:
   a first semiconductor layer;
   a second semiconductor layer having first and second surfaces, said first surface contiguous with said first semiconductor layer forming a light emitting junction at the interface of said first and second semiconductor layers;
   an oxide layer contiguous with said second surface of said second semiconductor layer;
   said oxide layer having a first opening of cross sectional area positioned within a first edge of said oxide layer and a second opening of cross sectional area larger than the first opening and positioned in a second edge opposite the first edge; and
   tapered passage means positioned between said first and second openings completing a passage therethrough.
2. The laser set forth in claim 1 together with fiber optic means positioned in optical alignment with the tapered passage means for enabling the laser to operate as a modulating transmitter.
3. The laser set forth in claim 1 wherein the tapered passage means is characterized as an elongated gap.
4. The laser set forth in claim 1 wherein the tapered passage means in characterized as an elongated cavity.
5. The laser set forth in claim 1 wherein said first opening in the nature of a square-shaped gap is centrally located along the first edge of the oxide layer and said second opening in the nature of a rectangular gap is centrally located along an opposite edge of the oxide layer thereby creating a tapered elongated gap.
6. The laser set forth in claim 1 wherein the oxide layer is sandwiched between said second semiconductor layer and a third layer of conductive material.
7. The laser set forth in claim 3 wherein the oxide layer has upper and lower surfaces tapered in substantially parallel relation to corresponding surfaces of the elongated gap.

8. The laser set forth in claim 4 wherein the oxide layer has upper and lower surfaces tapered in substantially parallel relation to corresponding surfaces of the elongated cavity.

9. The laser set forth in claim 6 wherein the second and third layers have untapered interfaces with the oxide layer.

10. The laser set forth in claim 6 wherein the second and third layers have tapered interfaces mating with the oxide layer.

11. A variable wavelength semiconductor laser comprising:

first and second semiconductor layers;

an active semiconductor layer intermediate to and contiguous with said first and second layers forming a light emitting junction at the interface between a first surface of said second layer and said active layer;

said first and second layers having a higher bandgap and a lower refractive index than said active layer so that light propagates in said active layer perpendicular to the junction by waveguiding action;

an oxide layer contiguous with a second surface of said second layer and in opposition to said junction;

said oxide layer having a first opening of rectangular cross sectional area positioned within a first edge of said oxide layer and a second opening of rectangular cross sectional area larger than the first opening and positioned in an opposite edge of said oxide layer; and tapered passage means positioned between said first and second openings completing a passage therethrough.

* * * * *